United States Patent [19]

Wang et al.

[11] 4,357,620

[45] Nov. 2, 1982

[54] LIQUID-PHASE EPITAXIAL GROWTH OF CDTE ON HGCDTE

[75] Inventors: Cheng-Chi Wang; Muren Chu, both of Thousand Oaks, Calif.

[73] Assignee: The United States of America as represented by the Secretary of the Army, Washington, D.C.

[21] Appl. No.: 207,863

[22] Filed: Nov. 18, 1980

[51] Int. Cl.³ ............... H01L 29/161; H01L 27/14
[52] U.S. Cl. ...................... 357/16; 357/30; 357/61
[58] Field of Search ............... 357/30, 16, 61

[56] References Cited

U.S. PATENT DOCUMENTS

| | | | |
|---|---|---|---|
| 3,718,511 | 2/1973 | Moulin | 148/171 |
| 3,809,584 | 5/1974 | Akai | 148/171 X |
| 3,858,306 | 1/1975 | Kloek | 148/171 |
| 3,884,788 | 5/1975 | Maciolek | 148/171 X |
| 3,902,924 | 9/1975 | Maciolek | 148/171 X |
| 3,988,774 | 10/1976 | Cohen-Solal | 29/572 X |
| 4,228,365 | 10/1980 | Gutierrez | 357/61 X |

OTHER PUBLICATIONS

Lanir et al., *Appl. Phys. Lett.*, Jan. 1, 1979, p. 50 et seq.

*Primary Examiner*—Martin H. Edlow
*Attorney, Agent, or Firm*—Arthur I. Spechler; Werten F. W. Bellamy; Jack W. Voigt

[57] ABSTRACT

Disclosed is a method of growing a layer of CdTe on HgCdTe by liquid phase epitaxy. The solution for growth comprises Sn and Hg with a small amount of CdTe. A typical composition is Sn:Hg:CdTe=36:5:0.15 parts by weight. The growth temperature is a function of the amount of CdTe in solution. For the typical composition stated, the growth temperature is about 520° C. The layers were grown on (111)A oriented CdTe substrates. The HgCdTe epilayer with a desired Cd composition is first grown, and an epilayer of CdTe is subsequently grown on the HgCdTe epilayer. The cross-diffusion at the CdTe/$Hg_{1-x}Cd_xTe$ interface has been as small as 0.3 $\mu m$ for the thin CdTe epilayer. The first CdTe/HgCdTe heterojunction sensitive to ~2.8 $\mu m$ at 77° K. has been demonstrated.

2 Claims, 5 Drawing Figures

LIQUID-PHASE EPITAXIAL GROWTH OF CDTE ON HGCDTE

DEDICATORY CLAUSE

The invention described herein was made in the course of or under a contract or subcontract thereunder with the Government; therefore, the invention described herein may be manufactured, used, licensed by or for the Government for governmental purposes without the payment of any royalties thereon.

BACKGROUND OF THE INVENTION

Since the advent of charge coupled devices, a new generation of signal processing techniques has evolved. Progress has shown that the silicon charge transfer device is one of the most important concepts in realizing visible imagers. Extending this technology to the infrared field has recently been the subject of intensive study in focal plane design for advanced military systems. Two approaches can essentially accomplish the same goal, namely, hybrid and monolithic focal planes. Hybrid focal planes, which involve mating sensitive intrinsic detectors to Si signal multiplexers or equivalent, are a near-term solution to system problems. In monolithic focal planes, photon detection and signal processing are accomplished in one semi-conductor and consequently, are cost effective in the long run.

The building blocks of monolithic infrared focal planes need not be restricted to extrinsic Si; other semiconductors can be developed and tailored to specific needs of systems. In fact, besides potentially higher temperature of operation, infrared focal planes using intrinsic semiconductors have an additional important advantage over Si in that a heterojunction structure can be designed to detect low infrared (IR) energy in the narrow gap semiconductor and transfer the resulting charges to the wider gap semiconductor for signal processing.

Mercury-cadmium telluride, ($Hg_{1-x}Cd_xTe$), which is an important intrinsic semiconductor for the fabrication of photovoltaic and photoconductive infrared detectors, can be tailored to cover a wide spectral range from visible to over 30 $\mu$ms. Although numerous techniques for growing HgCdTe bulk crystals have successfully been developed, the various techniques for growth of HgCdTe epitaxial layers have had limited success until modified liquid phase epitaxial (LPE) techniques were developed. LPE solves two typical problems encountered in the HgCdTe bulk crystal growth: compositional non-uniformity, and long annealing time to reach homogeneity. HgCdTe epitaxial layers also have the advantage of being suitable for making backside-illuminated detectors. In addition, LPE techniques can be adopted for growing HgCdTe multilayers which can be used for the fabrication of monolithic HgCdTe detectors and charge-coupled devices (CCD).

Advantageous would be a process for growing a layer of CdTe on a HgCdTe epitaxial layer that has been grown on a substrate of CdTe. The structure resulting from the above process offers the advantages of a backside-illuminated system since the CdTe substrate is transparent to IR. Since CdTe has a wide bandgap ($E_g = 1.6$ eV), the dark current of a charge-coupled device would be low. The CdTe layer could serve as a signal processer after a low level of IR is detected by a HgCdTe layer.

Therefore, an object of this invention is to provide a method of growing by liquid-phase epitaxial growth multilayers of $CdTe/Hg_{1-x}Cd_xTe$ with an x value from about 0.17 to about 1.0 on a CdTe substrate so that some mercury is always present in said $Hg_{1-x}Cd_xTe$ epitaxial layer.

Another object of this invention is to provide a process for growing multilayers of $CdTe/Hg_{1-x}Cd_xTe$ on a CdTe substrate which yields a structure, a CdTe/HgCdTe heterojunction, sensitive to $\sim 2.8$ micrometers at 77° K.

SUMMARY OF THE INVENTION

A HgCdTe monolithic focal plane is developed by first growing by liquid-phase epitaxial growth a HgCdTe epilayer with a desired Cd composition on a CdTe substrate, and then by growing a CdTe epilayer on the HgCdTe epilayer. In the resulting structure the HgCdTe layer is designed to sense IR radiation, and the CdTe substrate and the CdTe epilayer are effective in their function as radiation transmitter and as signal processing. The resulting structure is a heterojunction structure which detects low infrared (IR) energy in the narrow gap semiconductor and transfer the resulting charges to the wider gap semiconductor for signal processing.

In the process of this invention, $CdTe/Hg_{1-x}Cd_xTe$ multilayers with an x value from 0.3 to 0.5 are grown on CdTe substrates. The metallurgical and the electrical properties of these epitaxial layers were evaluated, and the compositions of these layers were analyzed both the energy dispersive analysis of x-ray (EDAX) and the secondary ion mass spectroscopy (SIMS) methods. The growth parameters are presented, and the spectral response of a CdTe/HgCdTe heterojunction is given. The data reported in support of the invention represents the first successful growth of CdTe on HgCdTe and the first suuccessful realization of CdTe/HgCdTe heterojunctions.

The HgCdTe epilayers are grown in Te solution in a modified vertical dipping LPE system designed from the liquid phase epitaxial growth system FIG. 1 disclosed in J. Electrochem. Soc. Solid-State Science and Technology, Jan. 1980, in the article titled: "Liquid Phase Growth of HgCdTe Epitaxial Layers" by C. C. Wang et al.

BRIEF DESCRIPTION OF THE DRAWING

The Figures of the drawing depict in

DESCRIPTION OF THE PREFERRED EMBODIMENT

Figure 1:
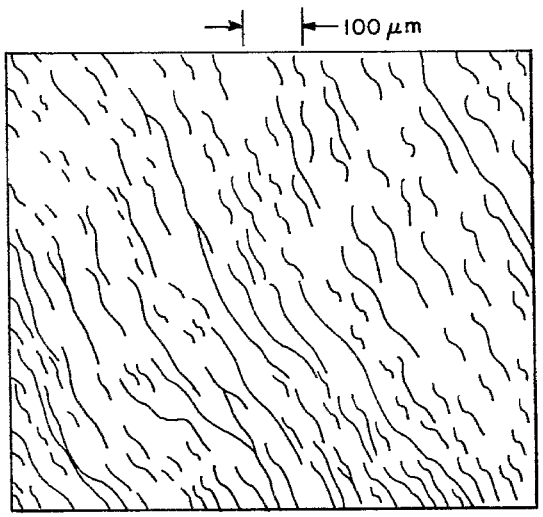
FIG. 1: an epilayer surface view shows the surface morphology of CdTe/HgCdTe multilayer in (111)A orientation.

The multilayer growth of this invention comprises CdTe/HgCdTe grown by liquid phase epitaxial (LPE) technique on a CdTe substrate.

A suitable high pressure system utilized for the growth of this invention consists of an inner quartz reaction tube and an outer quartz tube that is mounted between two stainless steel flanges to keep high argon gas pressure. The pressure inside the tube is maintained at 200–300 psi during growth. A positive Hg vapor pressure is maintained during the growth which is found not to be a critical parameter in growing a 20% HgCdTe layer reproducibly under high external pressure. The outer quartz tube is mounted in a vertical furnace that is controlled to within ±0.05° C. A thermocouple is inserted into the melt to monitor the actual melt temperatures. The inner reaction tube is plugged with high purity quartz wool to prevent excess mercury evaporation from the melt. A cold zone is established just below the quartz wool in order to condense mercury vapor.

In a typical growth, CdTe substrates are first lapped and chemically polished in a $Br_2$:HBr solution followed by a $Br_2$:$CH_3OH$ etch before loading in the growth chamber. Prior to growth, appropriate amounts of high purity (99.9999%) Hg and Cd are reacted in the Te melt at ~700° C. for an hour. For example, a typical ratio of CdTe:Hg:Te for 20% HgCdTe growth is 0.004:0.251:0.745. Subsequently, the melt and the oriented substrate are brought to the saturation temperature, typically at ~500° C. The saturation temperature is determined empirically in the growth system. The epilayers grown from solutions initially are either saturated or unsaturated by as much as ~15° C. In the latter case, examination of the epilayers shows that the substrates are melted back by the solution prior to growth. Through an interaction process it is possible to determine the liquid composition by dipping the known weight of CdTe into the melt of Hg and Te solutions at growth temperatures. The growth temperature normally drops at a rate of from 0.2° to 1° C./min with a typical value on the order of 0.25° C./min. In order to eliminate a Hg vapor diffused layer obtained during the heat-up cycle, the substrate is melted back at 550° C. for 15 sec in the growth solution prior to growth. A temperature profile of LPE when drawn by plotting temperature against time (hours) indicates a sharp temperature increase from ambient temperature for about 30–40 minutes to reach about 700° C. (the reaction temperature) which is maintained for about 40–60 minutes). When a known weight of the prepared CdTe substrate is dipped into the melt of Hg and Te solutions at beginning of growth temperature, the growth temperature normally drops at a rate of from 0.2° to 1° C./min with a typical value on the order of 0.25° C./min. After a predetermined time to achieve a predetermined thickness of the epilayer a cool down period from about 2 to about 3 hours is required. The actual LPE growth time takes about 30 minutes for a ~30 μm epilayer on the (111) oriented substrate, resulting in a growth rate of ~1 μm/min.

Table I provides a summary of growth conditions of HgCdTe with a Cd composition of 0.2. The HgCdTe epilayers are nominally p-type when undoped CdTe substrates are used but can be converted to n-type by annealing in Hg saturated vapor at temperatures around 300° C. These layers exhibit n-type conduction when grown on In-doped CdTe presumably as a result of indium diffusion from the substrate.

The HgCdTe epilayers can be grown on CdTe substrates with (100), (110), (111) Cd, and (111) Te orientations. Layers with thickness of from 1 to 300 μm have been grown. Under normal growth conditions, the deposition rate in (100) orientation is about 2 μm/min, which is twice as fast as that in (111) orientation.

TABLE I
GROWTH CONDITIONS AND PROPERTIES OF AS-GROWN HgCdTe EPILAYERS

(I) GROWTH CONDITIONS

| | |
|---|---|
| Melt composition | CdTe:Hg:Te = 0.004:0.251:0.745 |
| Container pressure | ~200 psi |
| Substrate orientations | (111) A |
| Growth temperature | ~500 ° C. |
| Reaction Temperature | ~700° C. |
| Growth time | 30 min |
| Cooling rate | 0.25° C./min |

(II) EPILAYER CHARACTERISTICS

| | | |
|---|---|---|
| Cd composition | 0.2 | |
| Thickness | 20 μm–30 μm | |
| CdTe/HgCdTe transition | 0.5–1 μm | |
| Carrier concentration (n-type) | $2 \times 10^{15}/cm^3$ | In doped Substrate |
| Electron mobility | $1 \times 10^5/cm^2 Vsec$ | |
| Carrier concentration (p-type) | $5 \times 10^{16}/cm^3$ | Undoped Substrate |
| Hole mobility | 400 $cm^2 Vsec$ | |

The surface of HgCdTe epilayer grown on a (111)Cd orientated substrate is sufficiently clear that a mirror smooth surface reflects the image of an object such as a ruler placed within the view angle of the surface. For example, the inch scale of a ruler is clearly reflected and easily read from the reflection in the mirror smooth surface. As in all the other LPE growth of semiconductors, the surface quality is dependent on the orientation of the substrate. It is found that the epilayer on (111)Cd oriented substrate always has a better surface morphology than that on the (111)Te oriented surface. In fact, the quality of (111)Cd oriented surface is also better than that on (110) and (100) surfaces.

Detailed examination of the epilayer surface quality on the (111)Cd face reveals that it is mirror smooth for a thickness of less than 10 μm and shows facets and sometimes terrace substructures for layers thicker than 30 μm. The terrace surface may be due to the substrate being slightly off the (111)Cd orientation and/or liquid-solid interface instabilities; it becomes more pronounced as the thickness increases. The surface of a (111)Te epilayer usually exhibits voids across the wafer, and the density of these voids increases as the layer becomes thicker.

Before the epitaxial growth, CdTe substrates which are of a typical size of 1.5×1.5 cm are first lapped with a 3200 mesh abrasive, chemically polished with a $Br_2$:HBr solution (2% $Br_2$ in volume), cleaned in deionized water, trichloroethylene, acetone, and methanol in an ultrasonic cleaner, and finally etched with a solution of 5% by volume of bromine in methanol to remove the polishing damage.

The (111)A oriented surface is preferred for the optimum CdTe substrate surface for HgCdTe growth; therefore, all multilayers discussed herein were grown on CdTe of this orientation. The growth conditions of the first layer (HgCdTe) includes a heat and reaction cycle, a melt back cycle, an LPE growth cycle, and a cool down cycle which will be described in more detail below. The super-cooling temperature is about 0.25° C./min which produces a quality HgCdTe epilayer. The growth temperature for a HgCdTe layer is typically 550° C. Subsequent procedures in CdTe growth were similar to those of the HgCdTe growth, except that a larger supercooling temperature (>15° C.) and a faster ramping rate (1° C. to 5° C./min.) are necessary in order to avoid melting the previously grown HgCdTe layer. The starting temperature for CdTe growth typically is ~525° C. The CdTe and HgCdTe epitaxial layers are, respectively, a few μm and 10-20 μm thick.

Figure 2:
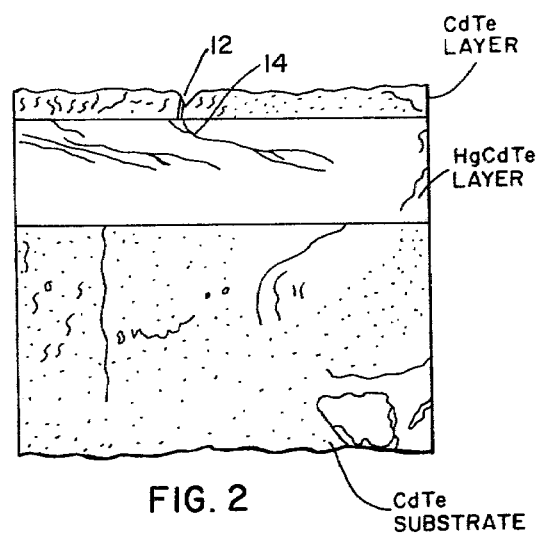
in FIG. 2: a cross-section of the double layer growth of CdTe/HgCdTe on a CdTe substrate.

In further reference to the Figures of the drawing, FIG. 1 shows the surface morphology of a CdTe/HgCdTe multilayer in (111)A orientation. The surface morphology, similar to that of HgCdTe single layers, appears to be a mirror surface to the naked eye, but shows some wavy structure under magnification. FIG. 2 shows the cross-section of a cleaved and chemically stained CdTe/HgCdTe multilayer on a CdTe substrate. The CdTe epilayer and CdTe substrate are darker because of the stain; the HgCdTe was not etched, and therefore retains a metallic color. Notice the planarity of the interfaces, indicating that minimum meltback and regrowth were taking place. The V-shape crack 12 in the CdTe layer is due to cleaving; it occurs at the end of the cleavage lines 14 as shown in the drawing. The thicknesses of CdTe and HgCdTe layers of this multilayer are 10 μm and 40 μm, respectively.

Figure 3:
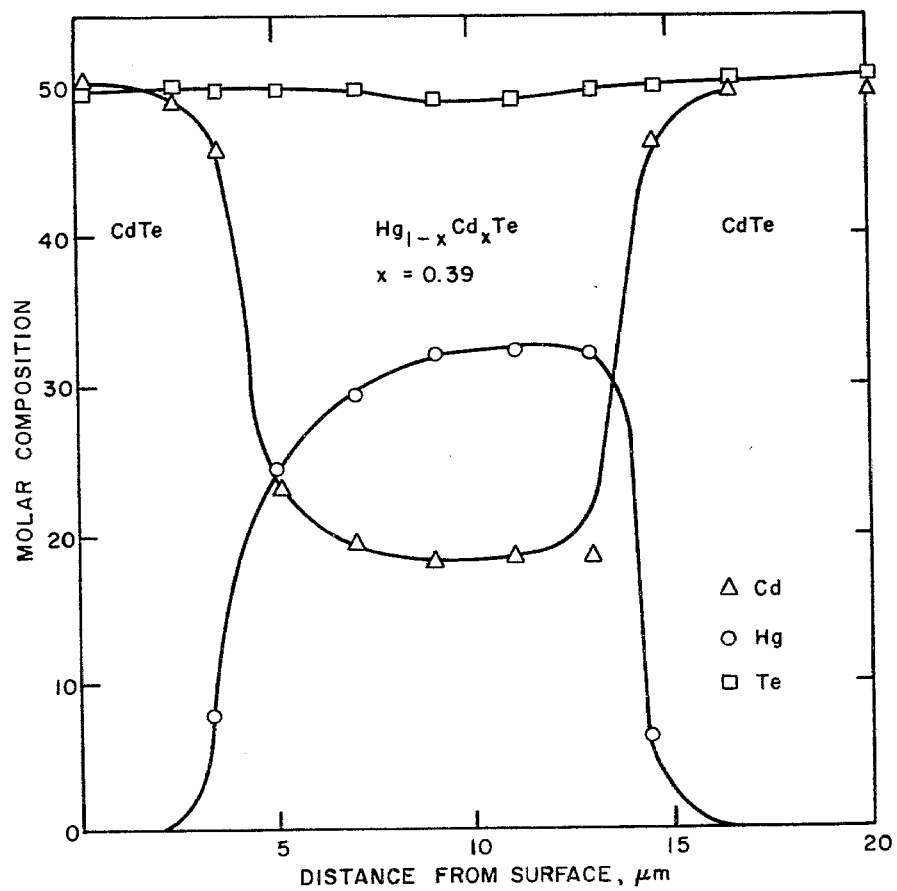
in FIG. 3: the compositional profile of CdTe/HgCdTe multilayers on a CdTe substrate.

The compositions of some multilayers were analyzed by EDAX measurements; FIG. 3 shows a typical result. The vertical axis is the molar composition, and the horizontal axis is the distance from the surface. The figure shows the interface between CdTe and HgCdTe epilayers is 5 μm from the surface, and the interface between the HgCdTe layer and the CdTe substrate is about 14 μm from the surface. The $Hg_{1-x}Cd_xTe$ layer shown in this figure has an x value of 0.39, which corresponds to a bandgap of 0.35 eV and an infrared transmission cut-on wavelength of 3.5 μm at 300 K. From FIG. 3, it can be seen that the cross-diffusion between the CdTe layer and the HgCdTe layer is much stronger than that between the HgCdTe layer and the CdTe substrate, as evidenced by the gradual transition of the Cd composition. Since the second melt (saturated with binary CdTe) is not normally in strict equilibrium with HgCdTe, the meltback often occurs during the growth of CdTe on HgCdTe. The problems related to meltback are controlled by supercooling the melt and growing the layer at a faster rate, as previously discussed.

Figure 4:
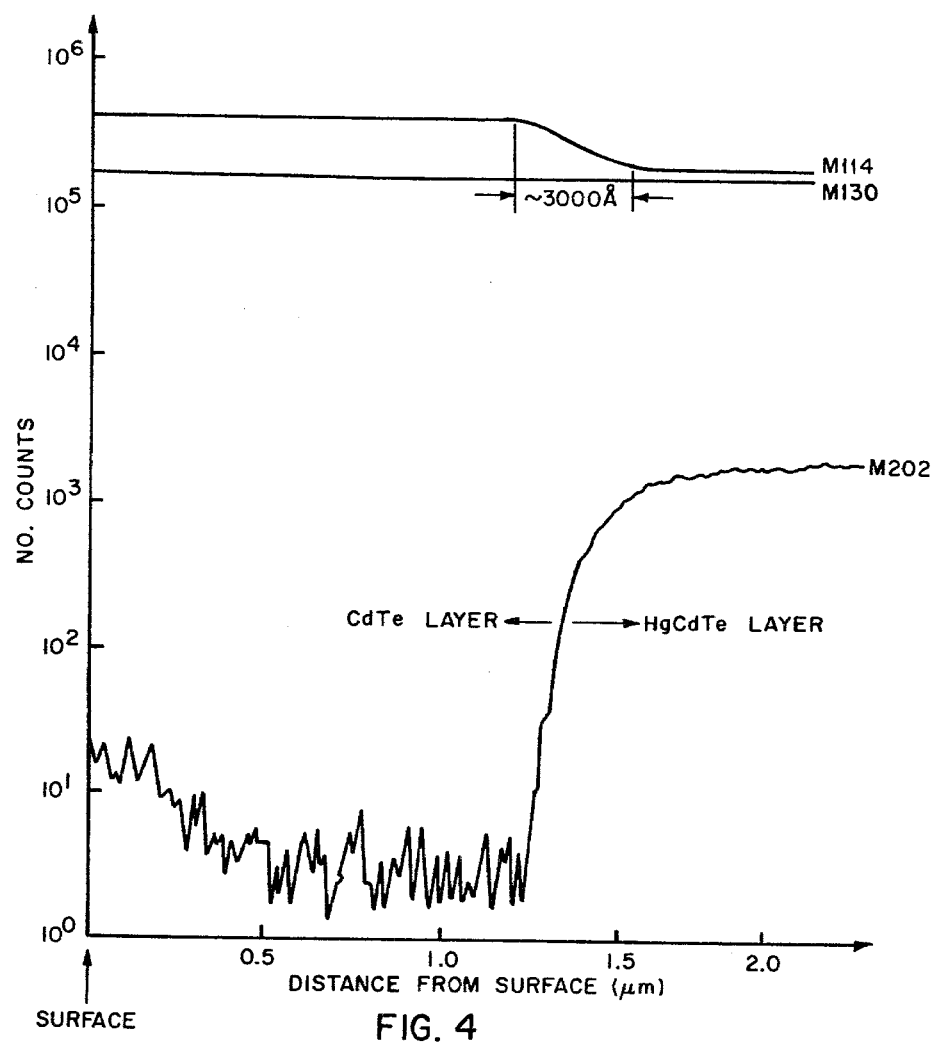
in FIG. 4: CdTe/HgCdTe grading as measured by secondary ion mass spectroscopy (SIMS)

The cross-diffusion of a CdTe/HgCdTe heterojunction has also been determined by the SIMS technique; one result is shown in FIG. 4. In this figure, M114, M130, and M202 are, respectively, Cd, Te and Hg profiles. The surface layer with a thickness of 1.2 μm is a CdTe epilayer, and no Hg was detected. The thickness of the cross-diffusion region is on the order of 3000 Å because the CdTe layer was thin and the growth time was short in this case. Below the interface there is a HgCdTe epilayer with a strong Hg signal. The accuracy of SIMS technique is ~10%, and is most convenient in examining a thickness up to ~2 μm.

Figure 5:
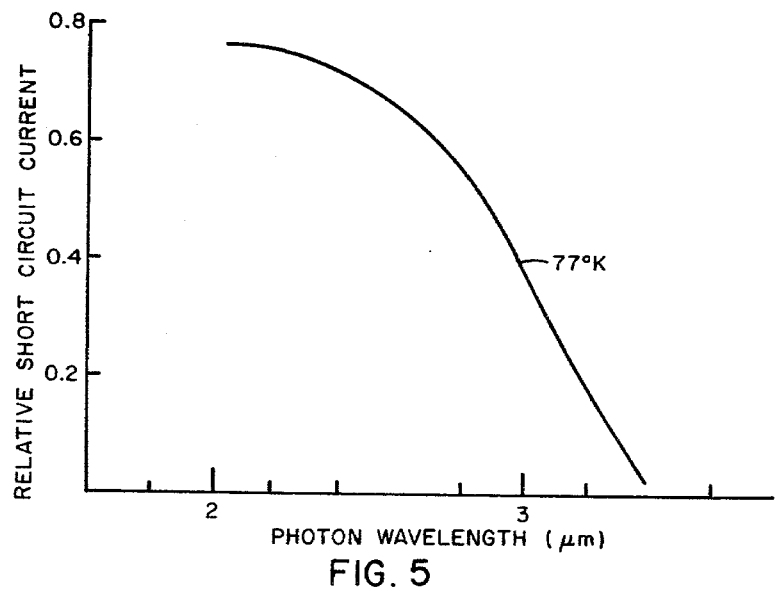
FIG. 5: the spectral response of a CdTe/HgCdTe heterojunction.

The as-grown HgCdTe layers without doping, are p-type with a carrier concentration from $5 \times 10^{16}$ to $1 \times 10^{17}$ cm$^{-3}$ and a mobility around 300 cm$^2$V$^{-1}$x$^{-1}$. These films can be converted to n-type with a carrier concentration $2 \times 10^{14}$ cm$^{-3}$ and a mobility of $2 \times 10^4$ cm$^2$V$^{-1}$s$^{-1}$, or to low carrier concentration p-type with a carrier concentration of $1 \times 10^{16}$ cm$^{-3}$ and a mobility of 650 cm$^2$V$^{-1}$s$^{-1}$ by annealing the samples under Hg saturated vapor at temperatures around 300° C. and 400° C., respectively. The as-grown HgCdTe layers can also be n-type by doping with indium in the grown solution or by growing on an indium-doped CdTe substrate. The CdTe films are, in general, p-type with a carrier concentration of from $10^{13}$ cm$^{-3}$ to $10^{15}$ cm$^{-3}$ and a mobility of from 50 cm$^2$V$^{-1}$s$^{-1}$ to 100 cm$^2$V$^{-1}$s$^{-1}$. By using the stated multilayer formation technique, rectifying p-CdTe/n-HgCdTe heterojunctions have been fabricated. FIG. 5 shows the spectral response of such a heterojunction which consists of a n-HgCdTe with a carrier concentration of $1 \times 10^{16}$ cm$^{-3}$ and a p-CdTe with a carrier concentration of $1 \times 10^{15}$ cm$^{-3}$. At 77 K., the spectral response of this junction has a cut-off wavelength at ~2.8 μm. It represents the first reported result on CdTe/HgCdTe heterojunctions.

The achievement of this invention of growing a CdTe epilayer on a HgCdTe epilayer that is first grown on a prepared substrate of CdTe is significant when one considers the difficult metallurgical problem encountered because of the associated high Hg vapor pressure during growth and the non-equilibrium nature between the saturated CdTe melt and HgCdTe. The results demonstrate that the growth of CdTe and HgCdTe epilayers on a CdTe substrate yields the first CdTe/HgCdTe heterojunction which is sensitive to 2.8 μm at 77 K. The disclosed epitaxial technology is the basic elements of the structure recognized as a monolithic structure in which a HgCdTe epilayer is employed for infrared detector in combination with a CdTe layer which is employed for signal processing. The process of this invention makes possible the achievement of a combination which has significant utility in infrared sensor technology.

We claim:

1. An infrared sensitive device which comprises a CdTe substrate that has been mechanically and chemically polished and has a (111)Cd oriented surface, an epitaxial layer of n-$Hg_{1-x}Cd_xTe$ grown on said substrate (111)Cd oriented surface by liquid-phase-epitaxial method, wherein x has a value from about 0.3 to about 0.5, and an epitaxial layer of p-CdTe grown on said epitaxial n-$Hg_{1-x}Cd_xTe$ layer surface by liquid-phase epitaxial method, said epitaxial layers forming a heterojunction wherein said n-$Hg_{1-x}Cd_xTe$ epitaxial layer serves as the infrared detector for said heterjunction which has the capability of being illuminated from the backside through said CdTe substrate which is transparent to infrared radiation and wherein said p-CdTe epitaxial layer serves as the signal processor for said heterojunction.

2. The infrared sensitive device of claim 1 wherein said CdTe/HgCdTe heterojunction is sensitive to 2.8 micrometers infrared radiation at 77° K., said n-$Hg_{1-x}Cd_xTe$ epitaxial layer being from about 10 to about 20 micrometers thickness and said p-CdTe epitaxial layer being from about 1 to about 2 micrometers thickness.

* * * * *